(12) United States Patent
Huang et al.

(10) Patent No.: US 9,537,483 B2
(45) Date of Patent: Jan. 3, 2017

(54) TOUCH PANEL HAVING A INSULATION LAYER

(71) Applicant: INNOLUX CORPORATION, Miaoli County (TW)

(72) Inventors: Po-Shan Huang, Miaoli County (TW); Chih-Han Chao, Miaoli County (TW); Po-Sheng Shih, Miaoli County (TW); Jia-Shyong Cheng, Miaoli County (TW)

(73) Assignee: INNOLUX CORPORATION, Miaoli County (TW)

( * ) Notice: Subject to any disclaimer, the term of this patent is extended or adjusted under 35 U.S.C. 154(b) by 148 days.

(21) Appl. No.: 14/489,081

(22) Filed: Sep. 17, 2014

(65) Prior Publication Data

US 2015/0035642 A1   Feb. 5, 2015

Related U.S. Application Data

(62) Division of application No. 12/826,599, filed on Jun. 29, 2010, now abandoned.

(30) Foreign Application Priority Data

Aug. 19, 2009  (CN) .......................... 2009 1 0305804

(51) Int. Cl.
*G06F 3/041* (2006.01)
*H03K 17/96* (2006.01)
*G06F 3/045* (2006.01)
*B82Y 15/00* (2011.01)

(52) U.S. Cl.
CPC ........... *H03K 17/9645* (2013.01); *G06F 3/045* (2013.01); *B82Y 15/00* (2013.01); *H03K 2217/96015* (2013.01); *Y10S 977/956* (2013.01)

(58) Field of Classification Search
CPC ................ G06F 3/045; H03K 17/9645; H03K 2217/96015; B82Y 15/00; Y10S 997/956
See application file for complete search history.

(56) References Cited

U.S. PATENT DOCUMENTS

| 5,181,030 A | 1/1993 | Itaya et al. |
| 5,506,375 A | 4/1996 | Kikuchi et al. |
| 6,081,259 A * | 6/2000 | Teterwak ................ G06F 3/044 178/18.01 |
| 6,304,251 B1 | 10/2001 | Ito et al. |

(Continued)

*Primary Examiner* — Amare Mengistu
*Assistant Examiner* — Crystal A Mathews
(74) *Attorney, Agent, or Firm* — WPAT, PC; Justin King

(57) ABSTRACT

A touch panel including a first insulation substrate, a first conductive film, a first insulation film, first conductive wires, a second insulation substrate, a second conductive film, and second conductive wires is provided. The first conductive film is disposed on the first insulation substrate and the first insulation layer covers a portion of a periphery of the first conductive film so that the first conductive film has an exposed region. The first conductive wires are disposed on the periphery of the first conductive film and each of the first conductive wires includes an electrode segment and an extending segment. The electrode segment is electrically connected with the first conductive film and the extending segment is electrically isolated from the first conductive film. The second conductive film is disposed on the second insulation substrate. The second conductive wires are disposed on the periphery of the second conductive film.

17 Claims, 8 Drawing Sheets

(56) References Cited

U.S. PATENT DOCUMENTS

| | | |
|---|---|---|
| 6,305,073 B1 | 10/2001 | Badders, Jr. |
| 6,356,259 B1 | 3/2002 | Maeda et al. |
| 6,522,322 B1 | 2/2003 | Maeda et al. |
| 6,552,718 B2 | 4/2003 | Ahn et al. |
| 7,227,537 B2 | 6/2007 | Nakayama et al. |
| 7,400,319 B2 | 7/2008 | Nakayama et al. |
| 7,455,529 B2 | 11/2008 | Fujii et al. |
| 7,499,038 B2 | 3/2009 | Nishikawa et al. |
| 7,710,406 B2 | 5/2010 | Fujii et al. |
| 7,825,905 B2 | 11/2010 | Philipp |
| 8,350,727 B2 | 1/2013 | Cheng et al. |
| 8,421,757 B2 | 4/2013 | Suzuki et al. |
| 8,481,855 B2 | 7/2013 | Shinoda et al. |
| 2002/0090798 A1 | 7/2002 | Ahn et al. |
| 2002/0149572 A1 | 10/2002 | Schulz et al. |
| 2003/0095111 A1 | 5/2003 | Song et al. |
| 2004/0100452 A1 | 5/2004 | Oh et al. |
| 2004/0130537 A1* | 7/2004 | Kong .................. G06F 3/0488 345/173 |
| 2005/0209392 A1 | 9/2005 | Luo et al. |
| 2006/0113346 A1 | 6/2006 | Togo |
| 2006/0192767 A1 | 8/2006 | Murakami |
| 2007/0182720 A1 | 8/2007 | Fujii et al. |
| 2008/0186418 A1 | 8/2008 | Kim et al. |
| 2008/0238882 A1 | 10/2008 | Sivarajan et al. |
| 2008/0252612 A1 | 10/2008 | Yu |
| 2009/0102810 A1 | 4/2009 | Jiang et al. |
| 2009/0134001 A1 | 5/2009 | Yamaue et al. |
| 2009/0153516 A1 | 6/2009 | Liu et al. |
| 2009/0153521 A1 | 6/2009 | Jiang et al. |
| 2009/0161060 A1* | 6/2009 | Li .......................... G06F 3/045 349/155 |
| 2009/0167707 A1 | 7/2009 | Jiang et al. |
| 2009/0201268 A1 | 8/2009 | Endo et al. |
| 2009/0256820 A1 | 10/2009 | Yanase et al. |
| 2009/0267913 A1 | 10/2009 | Suzuki et al. |

* cited by examiner

TOUCH PANEL HAVING A INSULATION LAYER

RELATED APPLICATIONS

This application is a divisional application of co-pending application No. U.S. Ser. No. 12/826,599, filed Jun. 29, 2010, which claims priority to China Application Serial Number 200910305804.1, filed Aug. 19, 2009, which is herein incorporated by reference.

BACKGROUND OF DISCLOSURE

Field of the Disclosure

The disclosure relates to a sensing apparatus, and more particularly, the disclosure relates to a touch panel.

Description of Related Art

Improvements in electronic and display technology allow significant enhancement of present operating interfaces. The most user-friendly and most popular operation method is touch operation, which means that a user directly touches or presses on images displayed on a screen to obtain the needed function or effect. The operation can be achieved by intuition so that it is convenient to children or elderly people.

The touch interface is commonly formed by a touch panel adhered on a display. The present touch panel can be divided into a resistive type, a capacitive type, an infrared type, and a surface acoustic type touch panels. A typical resistive touch panel includes two insulation substrates respectively having a conductive film and conductive wires, and one of the insulation substrates is adhered with a decorative substrate. The decorative substrate is directly touched by the user for performing an operation, which has characters, patterns, or a combination thereof for enhancing the beauty of the display.

However, the touch panel has at least three substrates (i.e. two insulation substrates and one decorative substrate), which results in the difficulty of reducing the thickness of the touch panel. In addition, because of the requirement for forming separate conductive blocks in the conductive film of the conventional touch panel, a wet etching process or a dry etching process (such as a laser etching process) is performed so as to increase the cost of manufacturing the touch panel. Furthermore, the wet etching process or the dry etching process can be harmful to the substrates.

SUMMARY OF THE DISCLOSURE

A first embodiment of the disclosure provides a touch panel including a first insulation substrate, a first insulation layer, a plurality of first conductive wires, a second insulation substrate, and a plurality of second conductive wires. The first insulation substrate has a first conductive film thereon contacting with the first insulation substrate. The first insulation layer covers a portion of a periphery of the first conductive film so that the first conductive film has a first exposed region. The first conductive wires are separately disposed on the periphery of the first conductive film and each of the first conductive wires includes a first electrode segment and a first extending segment. The first electrode segment contacts with the first exposed region to be electrically connected to the first conductive film. The first extending segment contacts with the first insulation layer to be isolated from the first conductive film. The second insulation substrate has a second conductive film thereon contacting with the second insulation substrate. The second conductive wires are separately disposed on a periphery of the second conductive film. The second insulation substrate is for connecting with an external circuit.

A second embodiment of the disclosure provides a touch panel including a first insulation substrate, a first insulation layer, a plurality of first conductive wires, a second insulation substrate, and a plurality of second conductive wires. The first insulation substrate has a first conductive film thereon contacting with the first insulation substrate. The first insulation layer covers a portion of a periphery of the first conductive film so that the first conductive film has a first exposed region. The first conductive wires are separately disposed on the periphery of the first conductive film and each of the first conductive wires includes a first electrode segment and a first extending segment. The first electrode segment contacts with the first exposed region to be electrically connected to the first conductive film. The first extending segment contacts with the first insulation layer to be isolated from the first conductive film. The second insulation substrate has a second conductive film thereon contacting with the second insulation substrate. The second conductive wires are separately disposed on a periphery of the second conductive film. The first insulation substrate is for connecting with an external circuit.

A third embodiment of the disclosure directs to a touch panel including a first insulation substrate, a plurality of first conductive wires, a second insulation substrate, and a plurality of second conductive wires. The first insulation substrate has a first conductive film contacting with the first insulation substrate, and the first conductive film has a first region and a plurality of second regions while the first region and the second regions are separated from one another. The first conductive wires are separately disposed on a periphery of the first conductive film and each of the first conductive wires includes a first electrode segment and a first extending segment. The first electrode segment contacts with the first region to be electrically connected to the first region. The first extending segment contacts with one of the second regions. The second insulation substrate has a second conductive film thereon contacting with the second insulation substrate. The second conductive wires are separately disposed on a periphery of the second conductive film. The first insulation substrate is for connecting with an external circuit.

In order to make the aforementioned and other features and advantages of the disclosure more comprehensible, embodiments accompanying figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF EMBODIMENTS

Figure 1A:
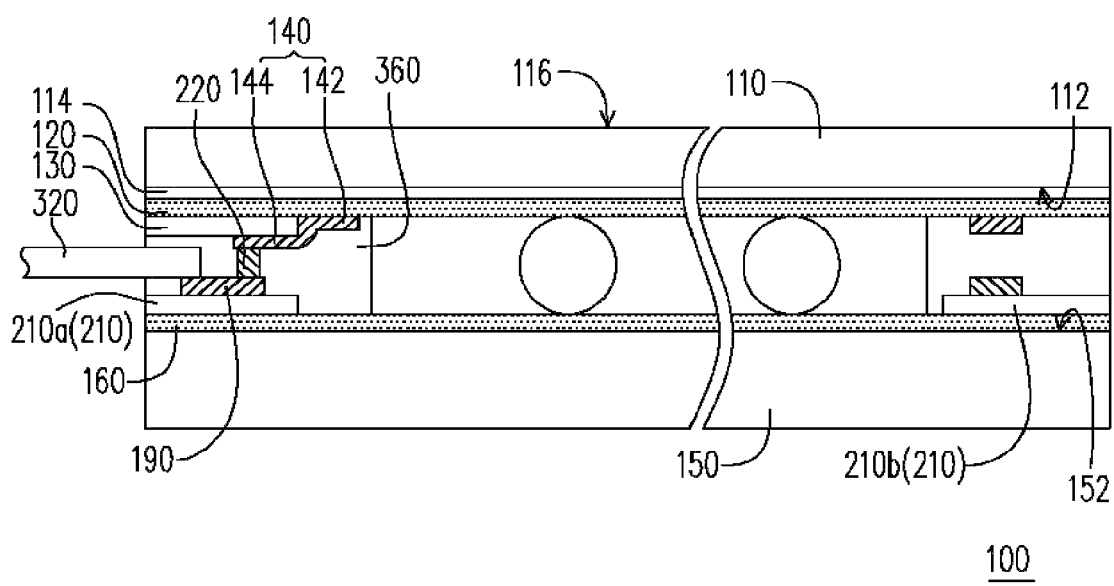
FIG. 1A is a schematic cross-sectional view of a touch panel according to a first embodiment of the disclosure.
Figure 1B:
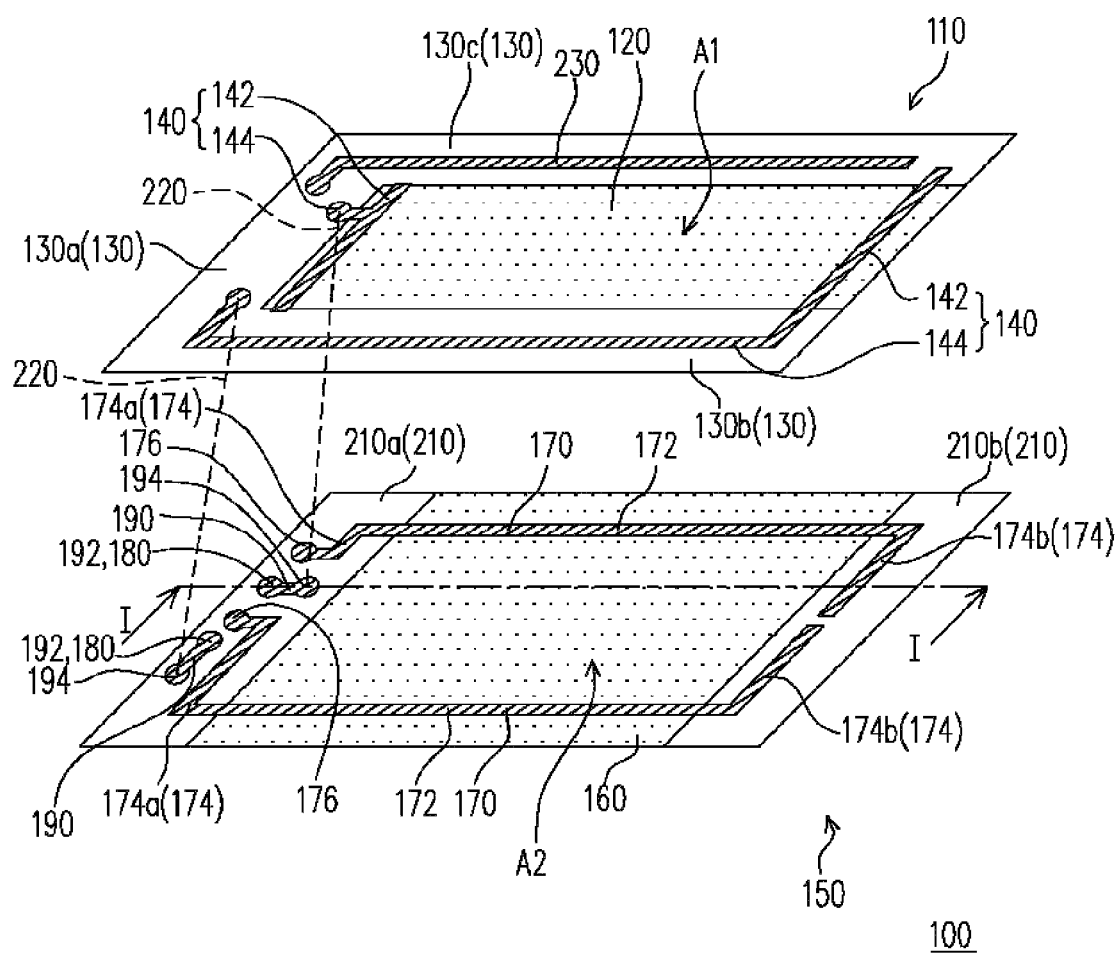
FIG. 1B is a schematic drawing of the two insulation substrates of the touch panel depicted in FIG. 1A.

FIG. 1A is a schematic cross-sectional view of a touch panel according to a first embodiment of the disclosure and FIG. 1B is a schematic drawing of the two insulation substrates of the touch panel depicted in FIG. 1A, and FIG. 1A is the schematic cross-sectional view taken along line I-I of FIG. 1B. For clearly showing the corresponding relationships of the structures on the two insulation substrates, the upper insulation substrate and the elements disposed thereon illustrated in FIG. 1B are shown upside down and the real disposition relationship can be referred to FIG. 1A.

A touch panel 100 of the present embodiment includes an insulation substrate 110, a conductive film 120, an insulation layer 130, a plurality of conductive wires 140, an insulation substrate 150, a conductive film 160, and a plurality of conductive wires 170. The insulation substrate 110 has a surface 112. In the present embodiment, the insulation substrate 110 can have, for example, a decorative substrate having patterns, characters, or a combination thereof. Specifically, a printed layer 114 can be disposed on the surface 112 and the printed layer 114 includes the patterns, the characters, or the combination thereof. However, in other embodiments, the printed layer 114 can also be disposed on an opposite surface 116 of the insulation substrate 110. In the present embodiment, the insulation substrate 110 can be a flexible transparent substrate having a material such as polyethylene terephthalate (PET). Additionally, in other embodiments, a material of the insulation substrate 110 can be other polymer or insulation materials.

The conductive film 120 is disposed on the surface 112. In the present embodiment, the conductive film 120 directly contacts with the decorative substrate (i.e. the insulation substrate 110). For example, the conductive film 120 can directly contact with the printed layer 114 of the decorative substrate. The insulation layer 130 covers at least a portion of a periphery of the first conductive film 120 and exposes an exposed region A1 of the conductive film 120. The conductive wires 140 are disposed on the periphery of the conductive film 120 and are separately disposed. Each of the conductive wires 140 includes an electrode segment 142 and an extending segment 144 and the electrode segment 142 and the extending segment 144 are connected with each other. The electrode segment 142 is disposed on the exposed region A1 and contacts with the exposed region A1 to be electrically connected to the conductive film 120. The extending segment 144 is disposed on the insulation layer 130 and contacts the insulation layer 130 to be isolated from the conductive film 120. In other words, the insulation layer 130 isolates the extending segment 144 from the conductive film 120. In the present embodiment, the insulation layer 130 includes three sub-insulation layers 130a, 130b, and 130c. The sub-insulation layers 130a and 130b are located at two adjacent margins of the conductive film 120 and the sub-insulation layers 130a and 130c are also located at two adjacent margins of the conductive film 120. A portion of each of the conductive wires 140 is isolated from the conductive film 120 through the sub-insulation layers 130a, 130b, and 130c and another portion of each of the conductive wires 140 contacts the exposed region A1.

The insulation substrate 150 has a surface 152 (as shown in FIG. 1A), and the surface 112 is faced to the surface 152. The insulation substrate 150 can be a transparent supporting substrate such as a flexible substrate or a rigid substrate. In the present embodiment, the insulation substrate 150 can be, for example, a glass substrate. Additionally, in other embodiments, a material of the insulation substrate 150 can be polycarbonate (PC), polymethylmethacrylate (PMMA), polyethylene terephthalate (PET), other polymer, or other insulation material. In the present embodiment, the insulation substrate 110 is closer to a touch surface of the touch panel 100 (the surface 116 is the touch surface in the present embodiment) than the insulation substrate 150 is while the touch surface is the surface capable of being touched or pressed by a finger, a nib of a touch pen, or other objects. In addition, in the present embodiment, the amount of the insulation substrates in the touch panel 100 is only two, i.e. the insulation substrates 110 and 150.

The conductive film 160 is disposed on the surface 152. In the present embodiment, the conductive film 160 contacts with the insulation substrate 150. The conductive wires 170 are disposed on a periphery of the conductive film 160 and are separately disposed. The insulation substrate 150 is provided to connect with an external circuit 320. In the present embodiment, the external circuit 320 is electrically connected to the extending segments 144 and the conductive wires 170. In the present embodiment, the external circuit 320 is, for example, a flexible printed circuit (FPC) board. However, in other embodiment, the external circuit 320 can be other circuit boards or conductive circuits. In the present embodiment, a composition of the conductive film 120 and the conductive film 160 includes a plurality of molecules with anisotropic conductivity and a size of each molecule with anisotropic conductivity is not larger than 300 nm. At least one of the conductive film 120 and the conductive film 160 includes a carbon nanotube (CNT) film, i.e. the molecule with anisotropic conductivity is a carbon nanotube. In the present embodiment, both of the conductive film 120 and the conductive film 160 are, for example, CNT films. However, in other embodiments, the conductive film 120 and the conductive film 160 can also be an indium tin oxide (ITO) films or other transparent conductive films. Alternately, one of the conductive film 120 and the conductive film 160 is the CNT film and the other one is another type of transparent film.

In the present embodiment, the touch panel 100 further includes an insulation layer 210 covering at least a portion of the periphery of the conductive film 160 and exposes an exposed region A2 of the conductive film 160. Each of the conductive wires 170 includes an electrode segment 172 and at least one extending segment 174 (such as the extending segments 174a and 174b shown in the figures). The electrode segment 172 is disposed on the exposed region A2 and contacts with the exposed region A2 to be electrically connected with the conductive film 160. In the present embodiment, the electrode segment 172 directly contacts with the conductive film 160. The extending segment 174 is disposed on the insulation layer 210 and contacts the insulation layer 210 to be isolated from the conductive film 160. In other words, the insulation layer 210 isolates the extending segment 174 from the conductive film 160. In the present embodiment, the insulation layer 210 includes two sub-insulation layers 210a and 210b located at two opposite margins of the conductive film 160, and a portion of each of the conductive wires 170 (such as the extending segments 174a and 174b) is disposed on the two sub-insulation layers 210a and 210b and another portion of each of the conductive wires 170 (such as the electrode segment 172) is disposed on the exposed region A2.

In the present embodiment, the touch panel 100 further includes a plurality of conductive pads 180 separately disposed on the insulation layer 210, and the conductive pads 180 are not electrically connected with the conductive wires 170, i.e. the conductive pads 180 and the conductive wires 170 are separately disposed. In addition, the extending segments 144 are electrically connected to the external circuit 320 through the conductive pads 180. In the present embodiment, a terminal of each of the extending segments 174a is configured with a contact point 176 and the conductive wires 170 are electrically connected to the external circuit 320 through the contact points 176, respectively.

The touch panel 100 can further includes a plurality of connecting wires 190 and each of the connecting wires 190 has an external connecting terminal 192 and an inner connecting terminal 194 opposite to the external connecting terminal 192. The conductive pads 180 are respectively configured in the external connecting terminals 192 and a terminal of each of the conductive wires 140 is electrically connected to the inner connecting terminal 194. In the present embodiment, a terminal of the extending segments 144 is electrically connected to the inner connecting terminals 194 through a plurality of conductive glues 220 so that the conductive wires 140 are electrically connected to the external circuit 320. In the present embodiment, the connecting wires 190 are disposed on the insulation layer 210 so as to be isolated from the conductive film 160, namely, the insulation layer 210 isolates the connecting wires 190 from the conductive film 160. For simplifying the drawing, the conductive glues 220 are represented by a dash line in FIG. 1B. In the present embodiment, a material of the conductive wires 140 and 170 and the connecting wires 190 can be silver or other metal. In other embodiments, a material of the conductive wires 140 and 170 and the connecting wires 190 can be other conductive material. Furthermore, in other embodiment, a terminal of the conductive wires 140 can be directly electrically connected to the external circuit 320 without connected through the connecting wires 190.

When the touch panel 100 is not pressed, the conductive film 120 and the conductive film 160 are separated by a gap and electrically insulated from each other. When a user touches the surface 116 of the insulation substrate 110 by a finger, the conductive film 120 where is pressed contacts and is electrically connected with the conductive film 160. In the present embodiment, the amounts of the electrode segments 142 and the electrode segments 172 are both two. The two electrode segments 142 are respectively disposed at two opposite margins of the touch panel 100 and the two electrode segments 172 are respectively disposed at the other two opposite margins of the touch panel 100. The external circuit 320 can be connected to a control platform (such as a computer, a processer, or a control circuit of an electronic apparatus), which determines the position touched by the finger through analyzing the resistances by measuring the electrode segments 142 and the electrode segments 172.

In the present embodiment, the insulation substrate 110 and the insulation substrate 150 are bonded through a double sided tape 360 (as shown in FIG. 1A), through other sealing materials or through other adhesions. In the present embodiment, the touch panel 100 can further includes at least one dummy wire 230 disposed on the insulation layer 130. The dummy wire 230 is electrically insulated with the conductive film 120 and has no actual function to the electric signals. The dummy wire 230 can be disposed corresponding to the conductive wires 170 so that the surface of the touch panel 100 formed by the assembly of the insulation substrate 110 and the insulation substrate 150 is flat.

In the touch panel 100 of the present embodiment, at least one insulation substrate, such as the insulation substrate 110 (or 150), uses the insulation layer 130 (or 210) thereon for isolating the extending segments 144 (or 174) of the conductive wires 140 (or 170) from the conductive film 120 (or 160) to replace the conventional method of separating the conductive film into separate blocks through the etching process. Therefore, in addition to be conducive to reduce the manufacturing cost, the touch panel 100 of the present embodiment is conducive to prevent the substrate from the damage caused by the etching process and improve the yield rate and reliability of the touch panel. In addition, the conductive film 120 and the conductive wires 140 of the present embodiment can be directly formed on the decorative substrate (i.e. the insulation substrate 110) so that the printed layer 114 on the decorative substrate is not destroyed by the wet etching process or the laser etching process. Accordingly, the insulation layer 130 used in the present embodiment is helpful in improving the yield rate of the decorative substrate.

Furthermore, in the touch panel 100 of the present embodiment, the insulation substrate 150 is to be connected with the external circuit 320, that is, the external circuit 320 is bonded with the connecting pads 180 and the contact point 176 on the insulation substrate 150 but not directly connected to the conductive wires 140 on the insulation substrate 110. Therefore, the external circuit 320 is not bonded with the insulation substrate 110 through a thermal compressing process so as to prevent the decorative substrate from the damage caused by the thermal compressing process.

In addition, the touch panel 100 of the present embodiment may merely use two insulation substrates 110 and 150 so that the thickness is decreased and the cost is reduced.

In addition, when the conductive films 120 and 160 are CNT films, the conductive films 120 and 160 can be formed on the insulation substrates 110 and 150 under a lower temperature condition or by the UV (ultra-violet light) curing process, which is more conducive to improve the yield rate and the reliability of the decorative substrate when it is compared to the high temperature condition in the sputtering process for forming the indium tin oxide film on the insulation substrate.

Figure 2:
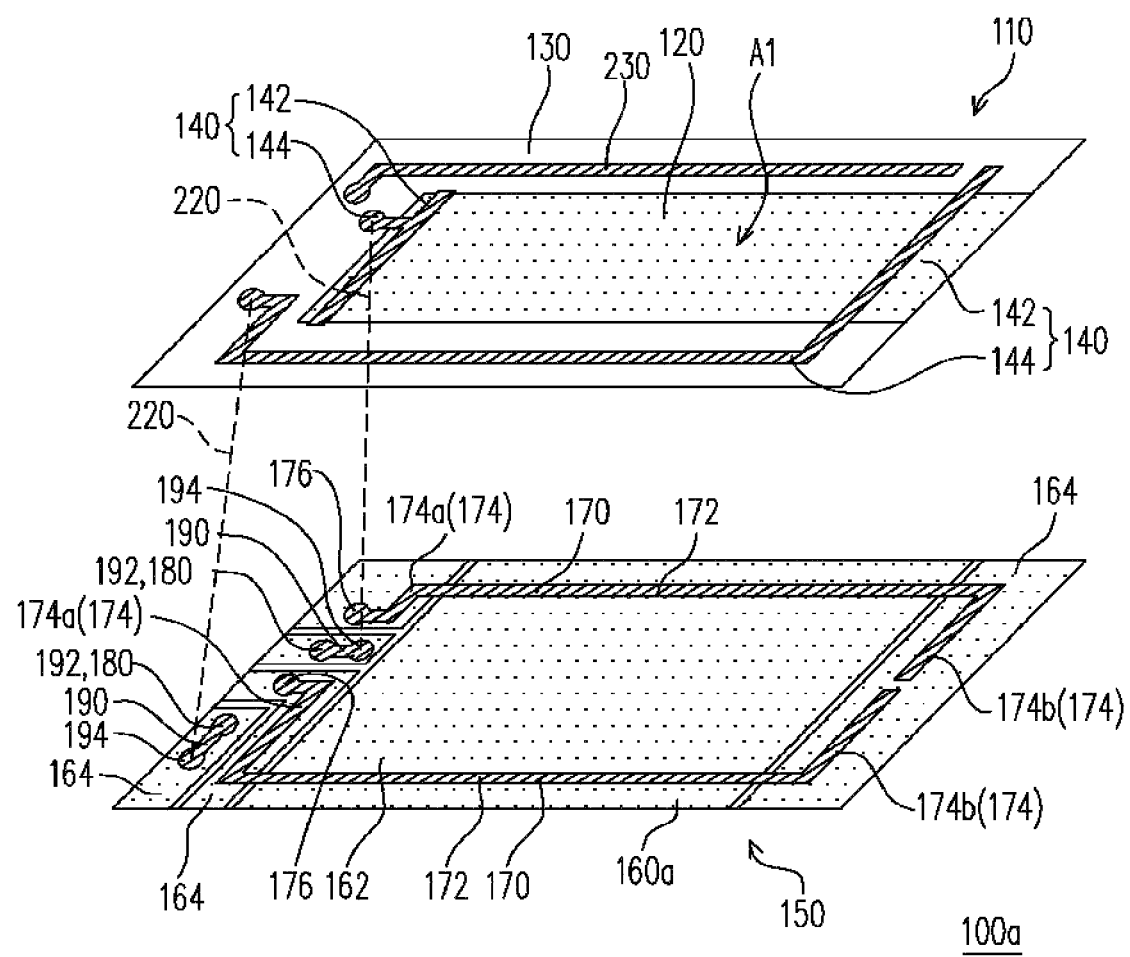
FIG. 2 is a schematic drawing of two insulation substrates of a touch panel according to a second embodiment of the disclosure.

FIG. 2 is a schematic drawing of two insulation substrates of a touch panel according to a second embodiment of the disclosure. Referring to FIG. 2, the touch panel 100a of the present embodiment is similar to the touch panel 100, and the difference between these two touch panels is described as below. In the touch panel 100a of the present embodiment, the insulation layer 210 depicted in FIG. 1B is not used. Alternatively, in the present embodiment, the conductive film 160a has a first region 162 and a plurality of second regions 164, and the first region 162 and the second regions 164 are separated from one another. The electrode segment 172 of each conductive wire 170 is disposed on the first region 162 and contacts with the first region 162 so as to be electrically connected with the first region 162. The extending segment 174 of each conductive wire 170 (such as the extending segments 174a and 174b) is disposed on at least one of the second regions 164 and contacts with the at least one of the second regions 164.

In addition, in the present embodiment, the conductive pads 180 are separately disposed on a portion of the second regions 164, and the conductive pads 180 are not electrically connected with the conductive wires 170, i.e. the conductive pads 180 and the conductive wires 170 are separated from each other. The extending segments 144 are electrically connected to the external circuit (such as the external circuit 320 illustrated in FIG. 1A) through the conductive pads 180, respectively. In addition, the connecting wires 190 are also disposed on the second regions 164.

Figure 3:
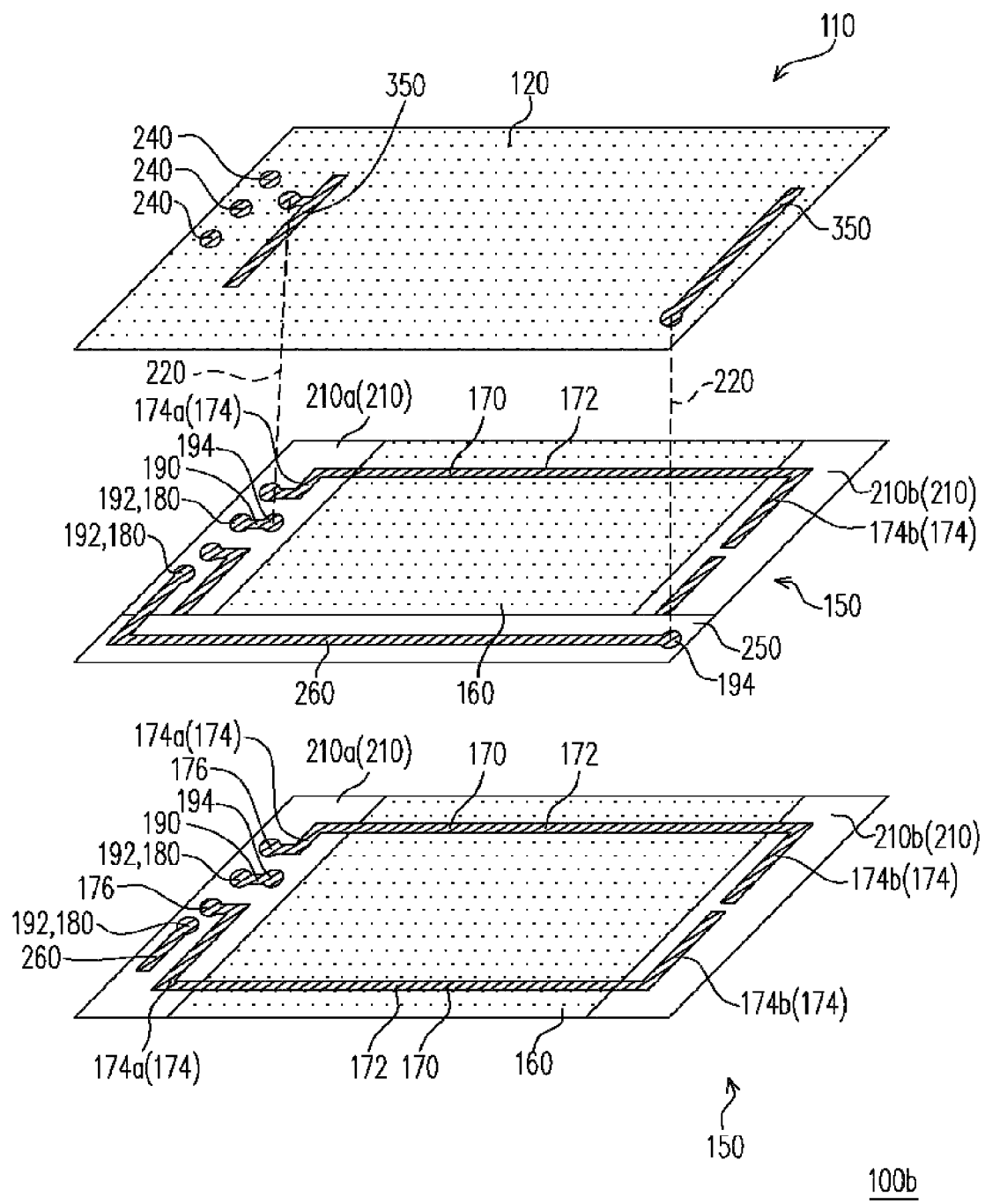
FIG. 3 is a schematic drawing of two insulation substrates of a touch panel according to a third embodiment of the disclosure.

FIG. 3 is a schematic drawing of two insulation substrates of a touch panel according to a third embodiment of the disclosure, and the structures configured on the bottom insulation substrate 150 are referred as the structures configured on the middle insulation substrate 150 without the insulation layer 250 and a portion of the connecting wires 260 while the portion of the connecting wires 260 is located on the insulation layer 250. Referring to FIG. 3, the touch panel 100b of the present embodiment is similar to the touch panel 100 in FIG. 1B, and the difference between these two touch panels is described as below. The insulation layer 130 in FIG. 1B is not disposed on the conductive film 120 in the present embodiment and the conductive wire 350 as a whole is served as an electrode.

The conductive pads 180 are separately disposed on the sub-insulation layer 210a. Furthermore, in the present embodiment, the touch panel 100b further includes a sub-insulation layer 250 disposed on the margin of the conductive film 160 and connecting the sub-insulation layer 210a and the sub-insulation layer 210b. In the present embodiment, the sub-insulation layer 250 covers a portion of at least one conductive wire 170 and a portion of each one of the two sub-insulation layers 210a and 210b. A portion of at least one connecting wire (the connecting wire 260 is taken as an example in the present embodiment) is disposed above the sub-insulation layer 250 and the conductive wire 170. The inner connecting terminal 194 of the connecting wire 260 is located above the insulation layer 250 and above the first sub-insulation layer 210b. The insulation layer 250 isolates the first conductive wire 170 from the connecting wire 260 and the insulation layer 210 isolates the connecting wires 190 and 260 from the conductive film 160. Moreover, the touch panel 100b of the present embodiment can further includes a plurality of dummy pads 240 disposed on the conductive film 120 and corresponding to the contact points 176 and the conductive pads 180 so as to improve the flatness of the touch panel 100b.

Figure 4:
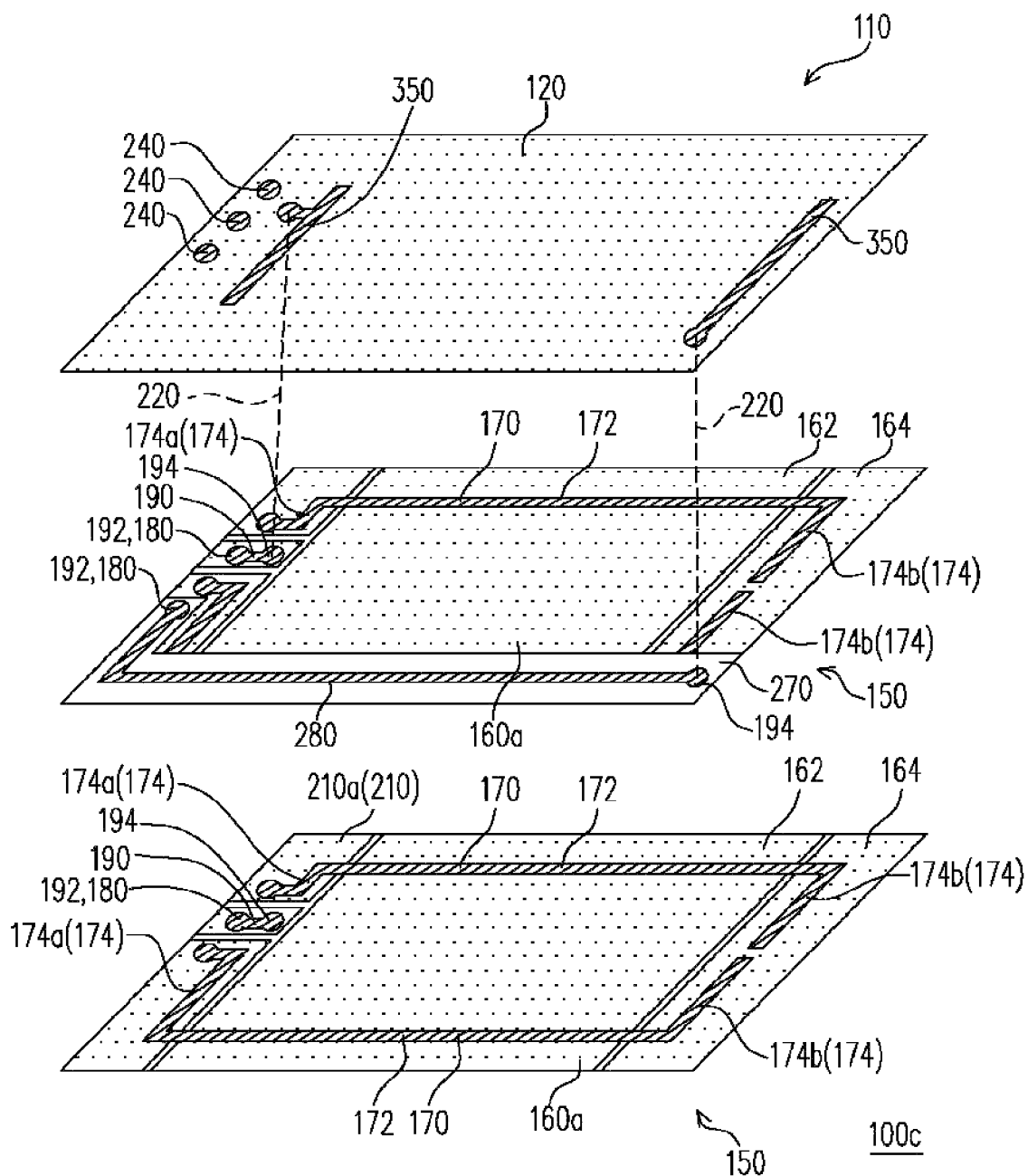
FIG. 4 is a schematic drawing of two insulation substrates of a touch panel according to a fourth embodiment of the disclosure.

FIG. 4 is a schematic drawing of two insulation substrates of a touch panel according to a fourth embodiment of the disclosure, and the structures configured on the bottom insulation substrate 150 are referred as the structures configured on the middle insulation substrate 150 without the insulation layer 270 and a portion of the connecting wires 280 while the portion of the connecting wires 280 is located on the insulation layer 270. Referring to FIG. 4, the touch panel 100c is similar to the touch panel 100b in FIG. 3. Specifically, the structures configured on the insulation substrate 110 of the touch panel 100c according to the present embodiment are the same as the structures configured on the insulation substrate 110 in FIG. 3, but the structures configured on the insulation substrate 150 according to the present embodiment are similar to the structures configured on the insulation substrate 140 in FIG. 2. The difference between the structures configured on the insulation substrate 150 according to the present embodiment and the structures configured on the insulation substrate 150 in FIG. 2 are provided below. In the present embodiment, the touch panel 100c further includes an insulation layer 270 covering at least a portion of the periphery of the conductive film 160a and covering a portion of one conductive wire 170. At least one connecting wire (the connecting wire 280 is taken as an example in the present embodiment) is disposed on the insulation layer 270 and extended from a corner of the conductive film 160a to an adjacent corner of the conductive film 160a. The connecting wire 280 and the electrode segment 172 of the conductive wires 170 covered by the insulation layer 270 (the lower electrode segment 172 in the figure) are respectively disposed at two opposite sides of the insulation layer 270. In the present embodiment, an extending direction of the electrode segment 172 is substantially parallel to an extending direction a portion of the connecting wire 280 located in the first region 162. Each one of the connecting wires 280 has an external connecting terminal 192 and an inner connecting terminal 194 opposite to the external connecting terminal 192 and the inner connecting terminals 194 are respectively electrically connected to the conductive wires 350. The external connecting terminal 192 is configured with the conductive pad 180. The external circuit (such as the external circuit 320 illustrate in FIG. 1A) is electrically connected to the extending segments 174a and the external connecting terminals 192. In addition, at least another connecting wire (the connecting wire 190 is taken as an example in the present embodiment) is disposed on at least one of the second regions 164.

Figure 5:
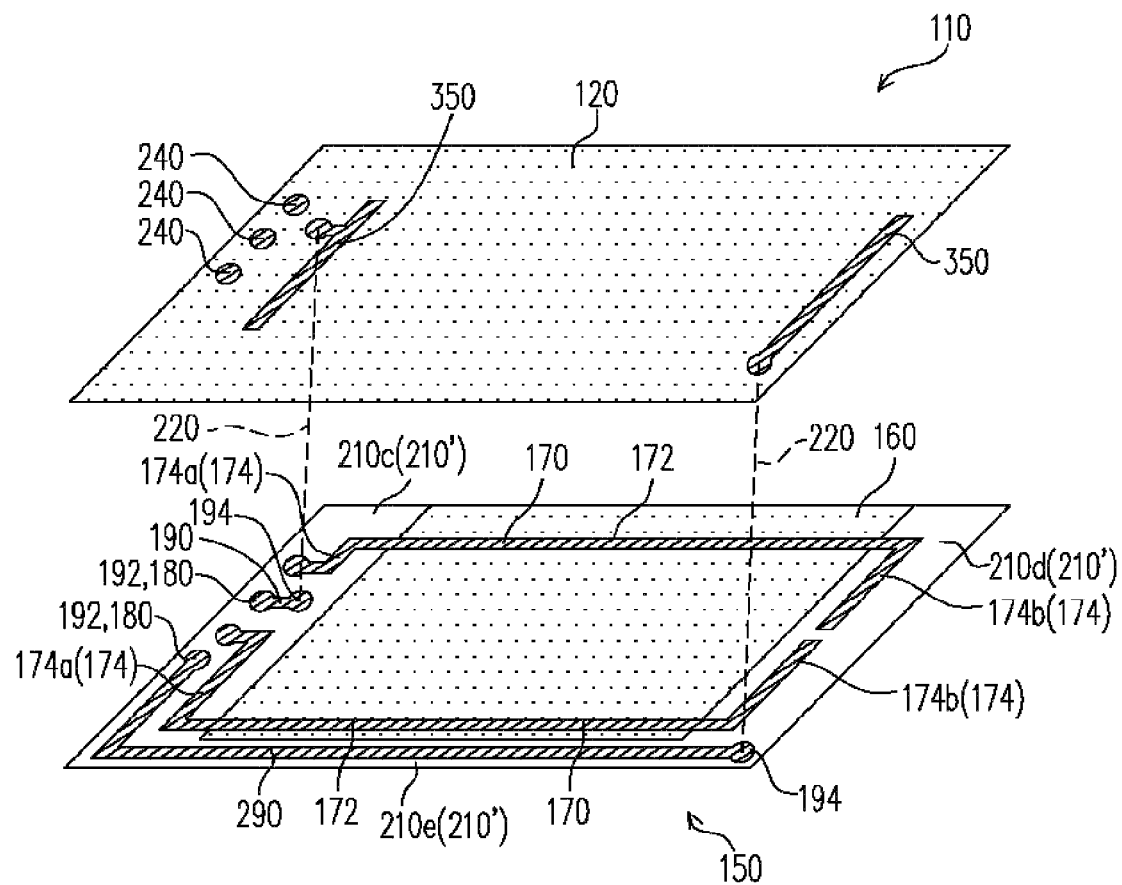
FIG. 5 is a schematic drawing of two insulation substrates of a touch panel according to a fifth embodiment of the disclosure.

FIG. 5 is a schematic drawing of two insulation substrates of a touch panel according to a fifth embodiment of the disclosure. Referring to FIG. 5, the touch panel 100d of the present embodiment is similar to the touch panel 100b in FIG. 3, and the difference between these two touch panels is described as below. The sub-insulation layer 250 in FIG. 3 is not disposed in the touch panel 100d of the present embodiment. Alternatively, the insulation layer 201' includes a sub-insulation layer 210c, a sub-insulation layer 210d, and a sub-insulation layer 210e. The sub-insulation layer 210c and the sub-insulation layer 210d are respectively disposed at two opposite margins of the conductive film 160. The sub-insulation layer 210e is disposed on the margin of the conductive film 160 and connects the sub-insulation layer 210c and the sub-insulation layer 210d. In the present embodiment, the sub-insulation layer 210e and one of the electrode segments 172 are disposed at the same side of the insulation substrate 150. In addition, in the present embodiment, an extending direction of the sub-insulation layer 210e is substantially parallel to the extending directions of all electrode segments 172. The conductive pads 180 are separately disposed on the sub-insulation layer 210c, and the conductive pads 180 and the conductive wires 170 are separately disposed and the conductive wires 350 are electrically connected to the external circuit (such as the external circuit 320 illustrated in FIG. 1A) through the conductive pads 180, respectively.

A portion of at least one connecting wire (the connecting wire 290 is taken as an example in the present embodiment) is disposed above the sub-insulation layer 210e and adjacent to the conductive wire 172. The inner connecting terminal 194 of the connecting wire 290 is located on the sub-insulation layer 210d and the insulation layer 210' isolates the connecting wire 290 from the conductive film 160.

In the touch panel 100d of the present embodiment, the connecting wire 290 disposed on the insulation substrate 150 is extended from a corner of the conductive film 160 to an adjacent corner thereof and connects the conductive wire 350 on the insulation substrate 110 to the external circuit, which is efficiently simplify the layout and reduce the amount of the conductive wires 350 on the insulation substrate 110. When the insulation substrate 110 is a decorative substrate, the connecting wire 290 is capable of simplifying the layout of the conductive wires 350 on the insulation substrate 110 so that the conductive wire 350 as a whole can be served as an electrode. Accordingly, the decorative substrate may be not treated by the dry etching process or the wet etching process to improve the yield and the reliability of the touch panel 100d.

Figure 6:
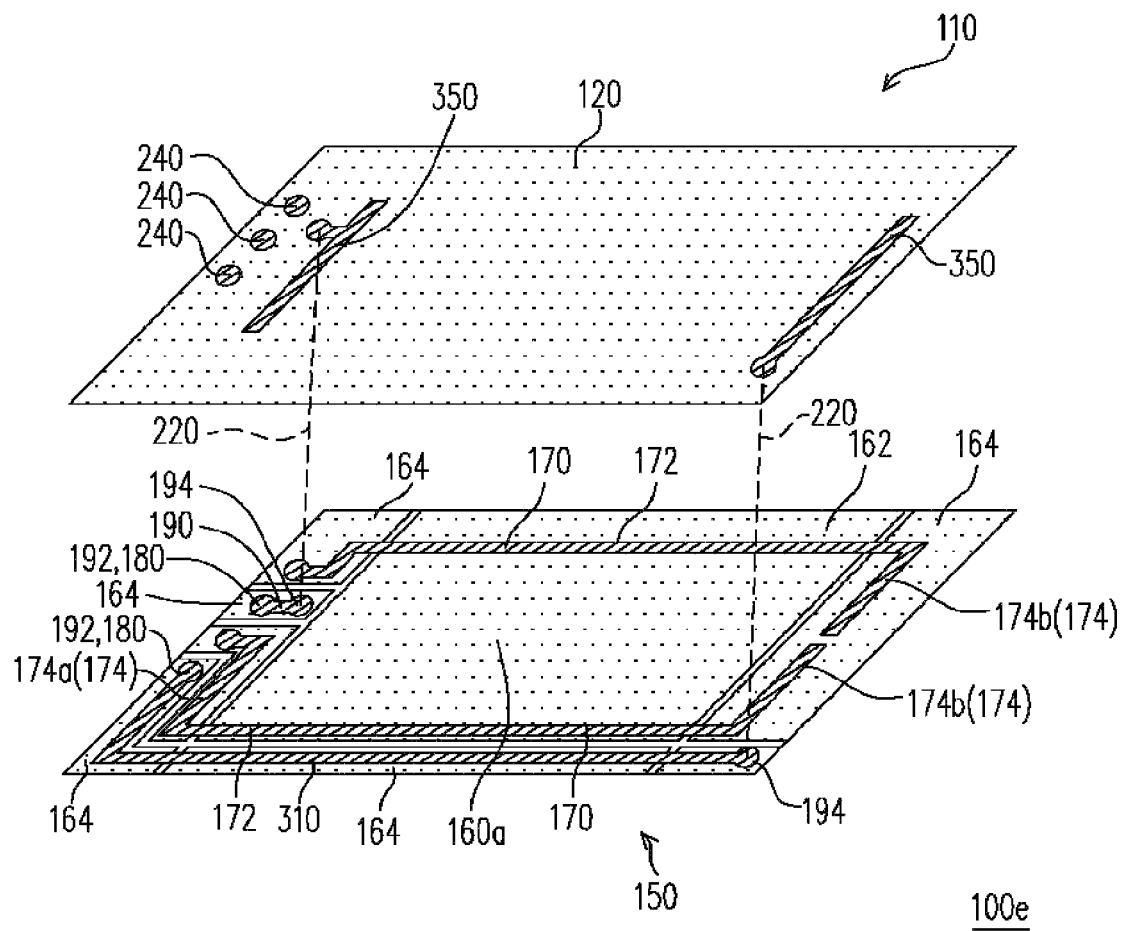
FIG. 6 is a schematic drawing of two insulation substrates of a touch panel according to a sixth embodiment of the disclosure.

FIG. 6 is a schematic drawing of two insulation substrates of a touch panel according to a sixth embodiment of the disclosure. Referring to FIG. 6, the touch panel 100e of the present embodiment is similar to the touch panel 100d in FIG. 5, and the difference between these two touch panels is described as below. In the touch panel 100e of the present embodiment, the insulation layer 210' depicted in FIG. 5 is not used. Alternatively, the conductive film 160a having a first region 162 and a plurality of second regions 164 is used in the touch panel 100e of the present embodiment, and the first region 162 and the second regions 164 are separated from one another. A plurality of connecting wires 190 and 310 are disposed on two or more of the second regions 164. At least one connecting wire (the connecting wire 310 is taken as an example in the present embodiment) is extended from a corner of the conductive film 160a to an adjacent corner thereof. In the present embodiment, the connecting wire 310 and one of the conductive wires 170 are disposed on the same side of the insulation substrate 150. In addition, in the present embodiment, an extending direction of a portion of the connecting wire 310 is substantially parallel to the extending directions of all electrode segments 172. Each one of the connecting wires (such as the connecting wires 190 and 310) has an external connecting terminal 192 and an inner connecting terminal 194 opposite to the external connecting terminal 192 and the inner connecting terminals 194 are respectively electrically connected to the conductive wires 350.

Figure 7:
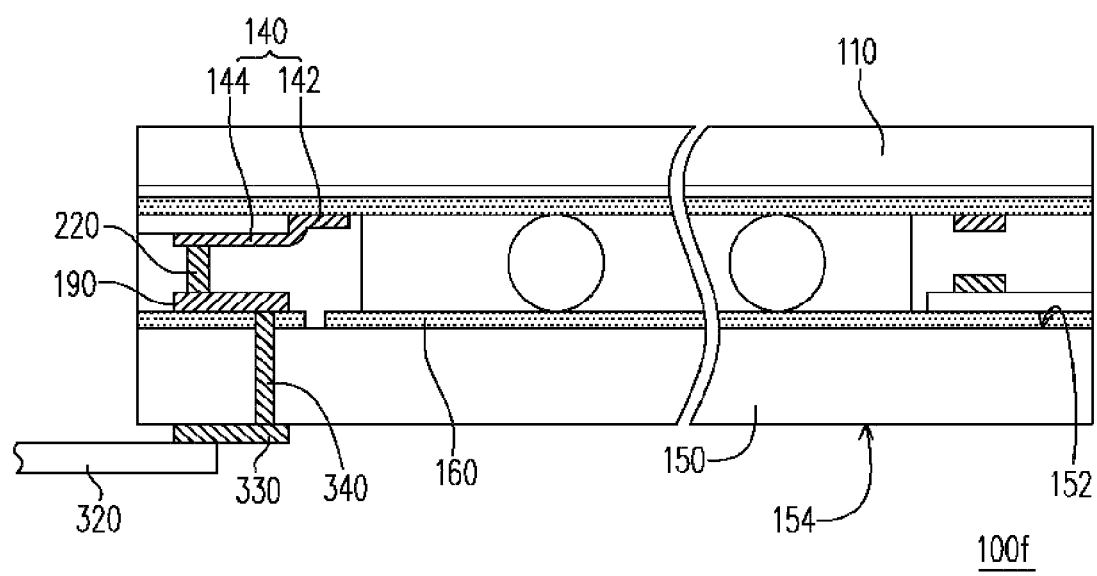
FIG. 7 is a schematic cross-sectional view of a touch panel according to a seven embodiment of the disclosure.

FIG. 7 is a schematic cross-sectional view of a touch panel according to a seven embodiment of the disclosure. The touch panel 100f of the present embodiment is similar to the touch panel 100 in FIG. 1A, and the difference between the two touch panels lies in that the external circuit 320 according to the present embodiment is disposed on the surface 154 of the insulation substrate 150, and the surface 154 is opposite to the surface 152. Specifically, a plurality of conductive pads 330 can be disposed on the surface 154, which are electrically connected to the conductive wires 170 (as shown in FIG. 1B) and the conductive wires 140 through a plurality of conductive through holes 340. The external circuit 320 is not disposed between the insulation substrate 110 and the insulation substrate 150 so as to further improve the flatness of the touch panel 100f.

In summary, according to a touch panel of the embodiment of the disclosure, the extending segments of the conductive wires on one insulation substrate is isolated from the conductive film by the insulation layer so as to have the advantages of lowering the manufacturing cost, preventing from the damage caused by the etching process on the substrate, enhancing the yield of the touch panel, and improving the reliability when it is compared with the conventional process of separating the conductive film into the isolated blocks by an etching process. In addition, the touch panel according to an embodiment of the disclosure, the connecting wire on one insulation substrate is extended from a corner of the conductive film to an adjacent corner thereof and connects the conductive wire on another insulation substrate to the external circuit so as to efficiently simplify the conductive wire on the another insulation substrate.

Although the present disclosure has been disclosed above by the embodiments, they are not intended to limit the present disclosure. Anybody skilled in the art can make some modifications and alteration without departing from the spirit and scope of the present disclosure. Therefore, the protecting range of the present disclosure falls in the appended claims.

What is claimed is:
1. A touch panel, comprising:
a first insulation substrate;
a first conductive film, covering said first insulation substrate, wherein said first conductive film comprises a first side, a second side, a third side, and a fourth side;
a first insulation layer, covering a continuous margin area along said first side, second side, and third side of said first conductive so that the first conductive film has a first exposed region uncovered by said first insulation layer;
a first conductive wire, disposed at a first portion of the first conductive film closest to the first side, comprising:
a first electrode segment, contacting with the first exposed region to be electrically connected to the first conductive film; and
a first extending segment, contacting with the first insulation layer to be isolated from the first conductive film;
a second conductive wire, disposed at a second portion of the first conductive film, comprising:
a second electrode segment, contacting with the first exposed region to be electrically connected to the first conductive film; and
a second extending segment, contacting with the first insulation layer along with said second side and isolated from the first conductive film;
a dummy wire, deposited on said first insulation layer along said third side and isolated from the first conductive film;
a second insulation substrate, wherein the second insulation substrate is for connecting with an external circuit;
a second conductive film, covering a second surface of the second insulation substrate, wherein the second conductive film has a first region and a plurality of second regions, the first region and the second regions are separated from one another;
a third conductive wire, disposed on the second conductive film;
a fourth conductive wire, disposed on the second conductive film; and
a plurality of connecting wires disposed on two or more of the second regions, wherein one of the connecting wires is extended from a corner of the first conductive film to an adjacent corner thereof, the connecting wires and one of the first conductive wires are disposed at a same side of the first insulation substrate, each of the connecting wires has an external connecting terminal and an inner connecting terminal, and the inner connecting terminals are respectively electrically connected to the second conductive wires;
wherein the second electrode segment contacts with the first region, and the second extending segment contacts with one of the second regions.

2. The touch panel as claimed in claim 1, further comprising a plurality of conductive pads separately disposed on a portion of the second regions, the conductive pads being not electrically connected with the second conductive wires, the first extending segments being respectively electrically connected to the external circuit through the conductive pads, a terminal of each second extending segment being configured with a contact point, and the second conductive wires being respectively electrically connected to the external circuit through the contact points.

3. The touch panel as claimed in claim 2, each of the connecting wires having an external connecting terminal and an inner connecting terminal opposite to the external connecting terminal, the conductive pads being respectively configured in the external connecting terminal, and a terminal of the first conductive wires being electrically connected to the inner connecting terminals.

4. The touch panel as claimed in claim 1, wherein said second conductive film comprises:
a first region; and
a plurality of electrically separated second regions;
wherein said third conductive wire comprises:
a third electrode segment, electrically connected with the first region; and
a third extending segment, disposed on at least one of said plurality of electrically separated second regions; and
wherein said fourth conductive wire comprises:
a fourth electrode segment, electrically connected with the first region; and
a fourth extending segment, disposed on at least one of said plurality of electrically separated second regions.

5. A touch panel, comprising:
a first insulation substrate having a first conductive film contacting with the first insulation substrate, the first conductive film having a first region and a plurality of second regions, and the first region and the second regions being separated from one another;
a first insulation layer covering a portion of a periphery of the first conductive film so that the first conductive film has a first exposed region;
a plurality of first conductive wires separately disposed at the periphery of the first conductive film, and each of the first conductive wires comprising:
a first electrode segment contacting with the first exposed region to be electrically connected to the first conductive film; and
a first extending segment contacting with one of the second regions and with the first insulation layer to be isolated from the first conductive film;
a second insulation substrate having a second conductive film thereon contacting with the second insulation substrate;
a plurality of second conductive wires separately disposed on a periphery of the second conductive film; and
a plurality of connecting wires disposed on two or more of the second regions, wherein one of the connecting wires is extended from a corner of the first conductive film to an adjacent corner thereof, the connecting wires and one of the first conductive wires are disposed at a same side of the first insulation substrate, each of the connecting wires has an external connecting terminal and an inner connecting terminal, and the inner connecting terminals are respectively electrically connected to the second conductive wires;
wherein the first insulation substrate is for connecting with an external circuit.

6. The touch panel as claimed in claim 5, wherein the second insulation substrate is more adjacent to a touch surface of the touch panel than the first insulation substrate is.

7. The touch panel as claimed in claim 5, wherein the second insulation substrate is a decorative substrate having patterns, characters, or a combination thereof.

8. The touch panel as claimed in claim 5, wherein the first insulation layer comprises:
a first sub-insulation layer;
a second sub-insulation layer, the first sub-insulation layer and the second sub-insulation layer being respectively disposed at two opposite margins of the first conductive film; and
a third sub-insulation layer disposed on a margin of the first conductive film and connecting with the first sub-insulation layer and the second sub-insulation layer.

9. The touch panel as claimed in claim 8, further comprising:
a plurality of conductive pads separately disposed on the first sub-insulation layer, the conductive pads being not electrically connected with the first conductive wires, and the second conductive wires being respectively electrically connected to the external circuit through the conductive pads.

10. The touch panel as claimed in claim 9, each of the connecting wires having an external connecting terminal and an inner connecting terminal opposite to the external connecting terminal, the conductive pads being respectively configured in the external connecting terminal, and a terminal of the second conductive wires being electrically connected to the inner connecting terminals.

11. The touch panel as claimed in claim 10, wherein a portion of one of the connecting wires is disposed above the third sub-insulation layer and one of the first conductive wires.

12. The touch panel as claimed in claim 10, wherein a portion of one of the connecting wires is disposed above the third sub-insulation layer and adjacent to one of the first conductive wires.

13. The touch panel as claimed in claim 5, wherein one of the first conductive film and the second conductive film comprises a carbon nanotube film.

14. A touch panel, comprising:
a first insulation substrate having a first conductive film contacting with the first insulation substrate, the first conductive film having a first region and a plurality of second regions, and the first region and the second regions being separated from one another;
a plurality of first conductive wires separately disposed at a periphery of the first conductive film, and each of the first conductive wires comprising:
a first electrode segment contacting with the first region to be electrically connected to the first region; and a first extending segment contacting with one of the second regions
a second insulation substrate having a second conductive film contacting with the second insulation substrate;
a plurality of second conductive wires separately disposed on a periphery of the second conductive film; wherein the first insulation substrate is for connecting with an external circuit; and
a plurality of connecting wires disposed on two or more of the second regions, wherein one of the connecting wires is extended from a corner of the first conductive film to an adjacent corner thereof, the connecting wires and one of the first conductive wires are disposed at a same side of the first insulation substrate, each of the connecting wires has an external connecting terminal and an inner connecting terminal, and the inner connecting terminals are respectively electrically connected to the second conductive wires.

15. The touch panel as claimed in claim 14, further comprising:
an insulation layer covering a portion of the periphery of the first conductive film and covering a portion of one of the first conductive wires;
wherein a first connecting wire of the connecting wires is disposed on the insulation layer and extended from a corner of the first conductive film to an adjacent corner thereof, the first connecting wire and the first electrode segment of the first conductive wire covered by the insulation layer being respectively disposed at two opposite sides of the insulation layer, each of the connecting wires having an external connecting terminal and an inner connecting terminal, and the inner connecting terminal being respectively electrically connected to the second conductive wires.

16. The touch panel as claimed in claim 15, wherein a second connecting wire of the connecting wires is disposed on one of the second regions.

17. The touch panel as claimed in claim 14, wherein one of the first conductive film and the second conductive film comprises a carbon nanotube film.

* * * * *